United States Patent [19]

Makofske

[11] Patent Number: 5,561,607
[45] Date of Patent: Oct. 1, 1996

[54] METHOD OF MANUFACTURE OF MULTI-CELL INTEGRATED CIRCUIT ARCHITECTURE

[75] Inventor: Robert Makofske, Palm Bay, Fla.

[73] Assignee: Harris Corporation, Melbourne, Fla.

[21] Appl. No.: 135,093

[22] Filed: Oct. 12, 1993

[51] Int. Cl.$^6$ ................................................ G06F 13/00
[52] U.S. Cl. ............................ 364/490; 364/489; 364/491
[58] Field of Search ................................ 371/22.1, 22.2, 371/22.3, 22.4, 22.5, 22.6; 307/448; 324/158 R, 73.1; 364/488–491; 326/38–41, 44, 101–103; 437/7, 8, 51, 900, 926

[56] References Cited

U.S. PATENT DOCUMENTS

| | | | |
|---|---|---|---|
| 3,961,254 | 6/1976 | Cavaliere et al. | 371/22.3 |
| 4,241,307 | 12/1980 | Hong | 371/22.1 |
| 4,357,703 | 11/1982 | Van Brunt | 371/22.5 |
| 4,461,000 | 7/1984 | Young | 371/22.2 |
| 4,499,579 | 2/1985 | Still et al. | 371/22.2 |
| 4,519,076 | 5/1985 | Priel et al. | 371/22.4 |
| 4,669,061 | 5/1987 | Bhavsar | 371/22.3 |
| 4,852,061 | 7/1989 | Baron et al. | 371/22.3 |
| 4,897,837 | 1/1990 | Ishihara et al. | 371/22.3 |
| 4,897,838 | 1/1990 | Tateishi | 371/22.3 |
| 5,054,024 | 10/1991 | Whetsel | 371/22.3 |
| 5,341,049 | 8/1994 | Shimizu et al. | 326/101 |
| 5,359,536 | 10/1994 | Agrawal et al. | 326/41 |
| 5,367,208 | 11/1994 | El Gamal et al. | 326/38 |
| 5,394,103 | 2/1995 | Cooke et al. | 326/41 |
| 5,406,138 | 4/1995 | Srinivasan et al. | 326/44 |

*Primary Examiner*—Ellis B. Ramirez
*Assistant Examiner*—Hal P. Wachsman
*Attorney, Agent, or Firm*—Charles E. Wands

[57] ABSTRACT

A standard cell topography has a generally rectangular topography, circumscribed by a set of four mutually orthogonal cell boundary edges. Coupled in circuit with a standard AND gate circuit within the cell are a pair of sense nodes for testing the AND gate. The sense MOSFETs are adjacent to opposite cell edges and are connected to respective sense nodes. First and second parallel metallic control links, which are used to gate the sense MOSFETs, extend the width of the cell between opposing cell boundary edges, so as to facilitate placement of the cells in boundary edge-abutting relationship, so that abutting control links may effectively form continuous runs through all the cells of a respective row of cells. A first output terminal of the first sense MOSFET is adjacent to one boundary edge and a second output node of the second terminal of the second sense MOSFET is adjacent to the other opposing cell boundary edge. This edge proximity placement of the output nodes of the sense MOSFETs facilitates coupling of the MOSFET output nodes to boundary edge-located sense terminals, which intersect the cell boundary edges.

16 Claims, 4 Drawing Sheets

METHOD OF MANUFACTURE OF MULTI-CELL INTEGRATED CIRCUIT ARCHITECTURE

FIELD OF THE INVENTION

The present invention relates in general to integrated circuits and is particularly directed to a standard cell architecture that includes, in addition to a prescribed signal processing functionality, one or more (e.g. a pair of) auxiliary selectively addressable switching devices, that provide controlled access to prescribed test nodes within the cell and are arranged in a cell topography that facilitates placement of and routing interconnect metal to the cell within a matrix-based multi-cell layout.

BACKGROUND OF THE INVENTION

Continuing improvements in the integration density of semiconductor circuit architectures have resulted in a substantial increase in the complexity of building blocks (both custom and non-application specific components) available to the (digital) signal processing system designer. Indeed, chip architectures may employ hundreds of thousands of logic gates to implement a prescribed signal processing function. Because the extremely large number of gates employed in a given architecture prevent it from being adequately tested by conventional vector-based test methodologies (which use only input and output pins of the chip), the incorporation of one or more test access, or 'sense', circuitry components (e.g. sense MOSFET switches) into each cell has been proposed, in order to allow an external testing system to gain access to critical nodes within the cell and thereby evaluate the functionality of each cell.

The fact that each cell is to contain such auxiliary test access circuitry means that, in addition to the normal interconnect highways provided for normal signal processing flow, the topography of the multi-cell architecture must include additional links to provide test access paths between each cell and the testing mechanism. Now, although it is possible to selectively form and interconnect runs of polysilicon to the control inputs of test access switching components (e.g. the gates of MOSFET sense transistors), because of the relatively long distances (thousands of microns of a typical VLSI architecture) of interconnect required, the resulting resistance and parasitic capacitance of the polysilicon layer becomes prohibitively high, which greatly increases access time. An additional problem is how to configure and place the test access circuitry within the standard cell, so as to keep the occupation area of each cell as small as possible.

SUMMARY OF THE INVENTION

In accordance with the present invention, the excessively high resistance and significant parasitic capacitance associated with the use of long runs of polysilicon as test access interconnect material, and the need to tailor the configuration and placement of the sense components within a standard cell, in order to minimize circuit occupation area and facilitate the fabrication of a multicell architecture of standard cells that can be readily arranged in mutual adjacency and readily interconnected with one another, are successively addressed by a new and improved controllably testable standard cell topography, which efficiently locates, within a respective cell, one or more (e.g. a pair) of addressable switching circuits and associated test access control lines that occupy minimal semiconductor real estate, while providing for two-dimensional hardware interconnect and test signal (control and sense signal) flow throughout an overall system architecture design.

More particularly, the sense circuit-containing standard cell topography of the present invention embodies a standard signal processing circuit architecture, such as a MOSFET-configured AND gate structure, having a generally rectangular topography geometry defined (circumscribed) by a set of four mutually orthogonal cell boundary edges. Coupled to prescribed circuit nodes with the AND gate are one or more (e.g. first and second) switching devices, which are controllably operative to couple the prescribed circuit nodes to sense output terminals by way of which an operational capability of the signal processing circuit (AND gate) is to be monitored, exclusive of the signal processing flow paths through the AND gate.

For this purpose, within the layout of the inventive standard cell topography, a first controllable switching device, in the form of a first MOSFET, is disposed adjacent to a first cell boundary edge, such that its drain and an associated drain region contact are located close to or in proximity of the first cell boundary edge. The first MOSFET has its source region located adjacent to a sub cell area within which the AND gate is formed, so as to facilitate placement of a connection link between the source and the AND gate proper. A second sense MOSFET is disposed adjacent to a second, opposing cell boundary edge, such that its drain and an associated drain region contact are located close to that the second cell boundary edge. The second MOSFET also is positioned within the cell such that its source region is located adjacent to the sub cell area within which the AND gate is formed.

The first sense MOSFET has its source terminal coupled to a first of the prescribed circuit nodes of the AND gate and its drain terminal coupled to the first sense output terminal. The gate of the first sense MOSFET is coupled to receive a control signal supplied by the test circuit for controllably causing the first sense MOSFET to provide a conductive path between the first prescribed circuit node and the first sense output terminal. The second sense MOSFET has its source terminal coupled to a second of the prescribed circuit nodes of the AND gate and its drain terminal coupled to the second sense output terminal. The gate of the second sense MOSFET is coupled to receive a control signal supplied by the test circuit for controllably causing the second sense MOSFET to provide a conductive path between the second prescribed circuit node and the second sense output terminal.

Also contained within the cell topography are a plurality of control links (e.g. respective first and second control links), which are comprised of a first metal layer and are arranged in the cell such that they are parallel to one another and extend the width of the cell between the first and second opposing cell boundary edges. Because the control links extend between opposing boundary edges, placement of respective cells in cell boundary edge-abutting relationship effectively forms continuous runs or strips of each of the control links through all the cells of a respective row of a multi-cell matrix.

While there is no restriction to the cell topography location of the output (drain) nodes of the first and second MOSFETs within the cell, placing the output (drain) nodes of the first and second sense MOSFETs adjacent to opposing cell boundary edges facilitates coupling of the MOSFET output nodes to 'boundary edge-located' sense terminals, which intersect the cell boundary edges. Placing sense terminals at the cell boundary edges allows the sense terminals to be readily bridged by a (second metal) layer extending in a column direction of the multi-cell matrix, namely, in direction orthogonal to the first and second (first metal) control links interconnecting edge-located output terminals of successive rows of cells.

Arranged orthogonal to the plurality of control links are one or more (e.g. first and second in the case of a two sense node cell) control node connection links, which extend between the respective gates of the first and second sense MOSFETS and the (first and second) control links. In order to prevent sense nodes of abutting cells which share the same sense terminal from being simultaneously coupled to their shared sense terminal, their associated control node connection links are coupled to selected ones of the first and second control links through which the sense MOSFETs are addressed. As a result, through one of the (first and second) control links, the test access circuitry is able to individually address each sense MOSFET contained in a respective cell and thereby cause a selected (addressed) one of the first and second prescribed nodes of the cell to be conductively coupled through the enabled MOSFET switch to its associated sense output terminal, to which the second layer of metal is connected.

DETAILED DESCRIPTION

As pointed out briefly above, the present invention is directed to a new and improved standard cell topography for incorporating one or more test access, or 'sense', circuitry components, in particular one or more sense MOSFETs, into a respective standard cell, in order to allow an external testing system to gain access to one or more critical 'sense' nodes within the cell so as to permit testing of the functionality of the cell.

Figure 1:
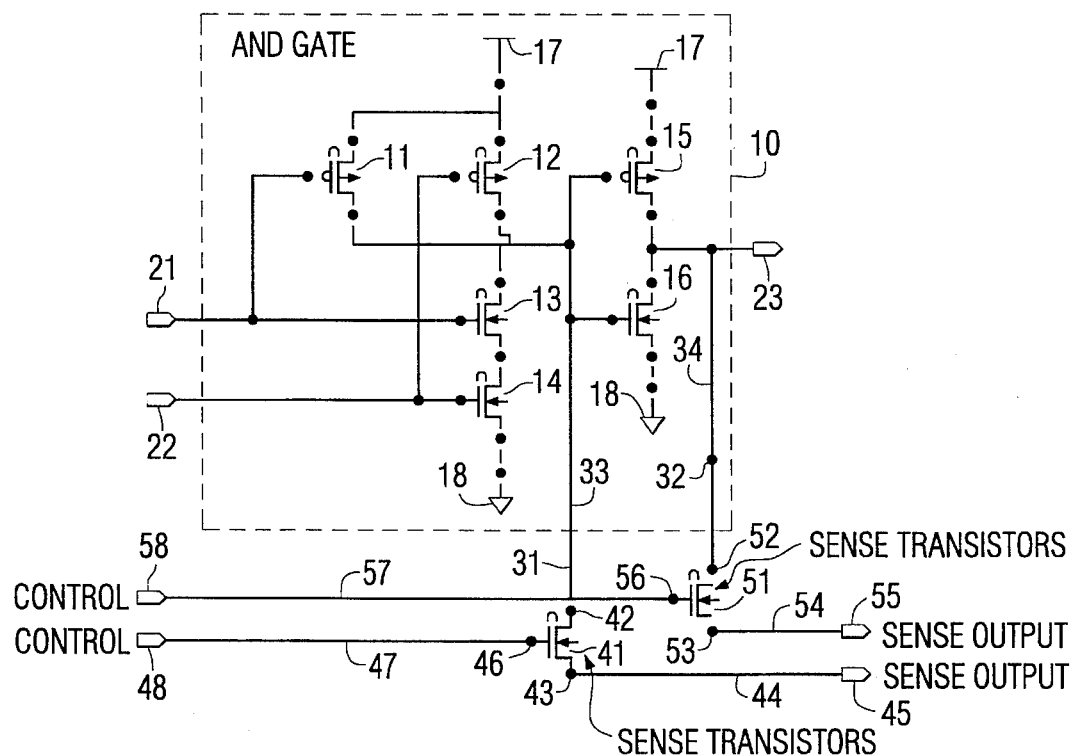
FIG. 1 schematically illustrates the circuitry composition of a non-limitative example of a standard cell in accordance with an embodiment of the present invention containing an AND gate and a pair of sense MOSFETs.

FIG. 1 schematically illustrates the circuitry composition of a non-limitative example of a standard (signal processing) cell that contains a pair of test access points or sense nodes, access to which by an external testing device is to be provided. More particularly, the sense circuit-containing standard cell of FIG. 1 comprises a MOSFET-configured logic circuit (an AND gate in the illustrated example), designated (surrounded) by broken lines 10. AND gate 10 is formed of a set of interconnected MOSFETs 11–16 that are coupled in circuit with power supply rails 17 and 18, and provide an 'AND' logic signal processing path between first and second logic input terminals 21, 22 and a logic output terminal 23.

Coupled in circuit with AND gate 10 are one or more (two in the illustrated embodiment) sense nodes 31, 32, by way of which an operational capability of the AND gate 10 is to be monitored, exclusive of the signal processing flow paths through the AND gate. A first of the two sense nodes, sense node 31, is shown as being coupled via link 33 to the input of an inverter comprised of MOSFETs 15 and 16, while a second sense node 32 is shown as being coupled via link 34 to the output of the inverter, which corresponds to the logic output terminal 23 of the AND gate.

A first controllable switching device, in the form of a first MOSFET 41, has its source electrode 42 coupled to sense node 31 and its drain electrode 43 coupled via link 44 to a first sense output terminal 45. The first sense MOSFET 41 has its gate 46 coupled via link 47 to a first control node 48, to which a first test access control signal is selectively applied by a test circuit (not shown) for controllably causing the first sense MOSFET 41 to provide a conductive path between the first sense node 31 and the first sense output terminal 45.

Similarly, a second controllable switching device, in the form of a second MOSFET 51 has its source electrode 52 coupled to sense node 32 and its drain electrode 53 coupled via link 54 to a second sense output terminal 55. The second sense MOSFET 51 has its gate 56 coupled via link 57 to a second control node 58, to which a second test access control signal is applied by the test circuit for controllably causing the second sense MOSFET 51 to provide a conductive path between the second sense node 32 and the second sense output terminal 55.

Figure 2:
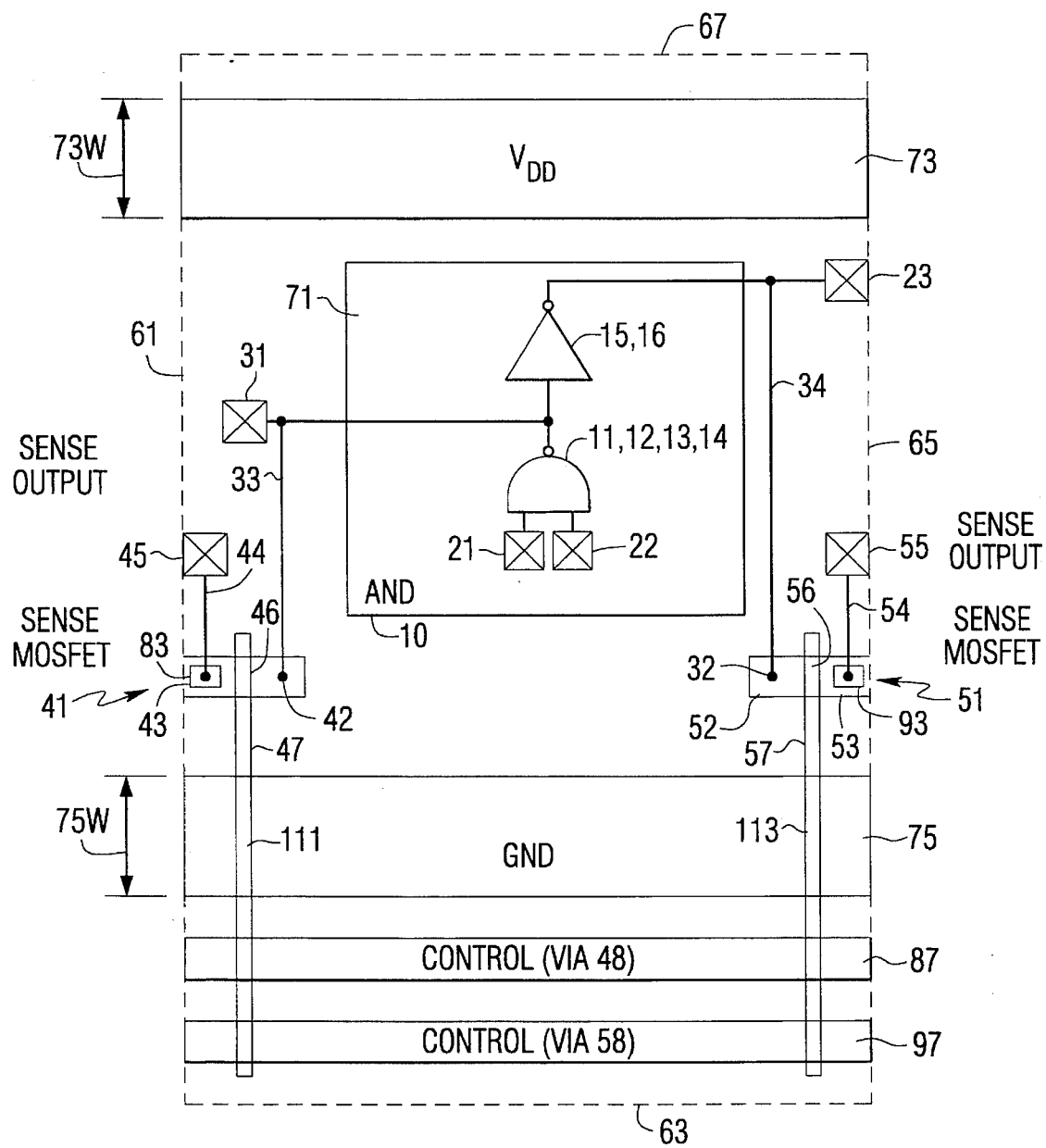
FIG. 2 diagrammatically illustrates the topography of the architecture of the standard cell circuit of FIG. 1.

The topography of the standard cell of FIG. 1 is diagrammatically illustrated in FIG. 2 as having a generally rectangular geometry, which is circumscribed by a set of four mutually orthogonal cell boundary edges 61, 63, 65 and 67. In order to avoid cluttering the drawing, the circuit component regions of which AND gate 10 is comprised have not been shown in detail; instead the topography of AND gate 10 has been illustrated as a sub cell geometery area or region 71 within the cell area defined by the rectangularly arranged cell boundary edges 61, 63, 65 and 67.

The standard cell topography also includes power supply bus links 73 and 75 (e.g. VDD and ground), which have respective widths 73W and 75W, links 73 and 75 extending widthwise across the cell, terminating at left hand cell boundary edge 61 and right hand cell boundary edge 65.

Within the layout of the cell topography of FIG. 2, the first controllable switching device, i.e. first sense MOSFET 41, is disposed adjacent to the left hand cell boundary edge 61, such that its drain 43 and an associated drain region contact 83 are located in close proximity to cell boundary edge 61. First sense MOSFET 41 has its source region 42 located adjacent to the sub cell area 71 within which AND gate 10 is formed, so as to facilitate placement of connection link 33 to the first prescribed sense node 31 of the AND gate circuitry to be monitored.

Similarly, second sense MOSFET 51 is disposed adjacent to the right hand cell boundary edge 65, such that its drain 53 and an associated drain region contact 93 are located close to that cell boundary edge 65. Second sense MOSFET 51 has its source region 52 located adjacent to the sub cell area 71 within which AND gate 10 is formed, so as to facilitate placement of connection link 34 to the second prescribed sense node 32 to be monitored.

Figure 3:
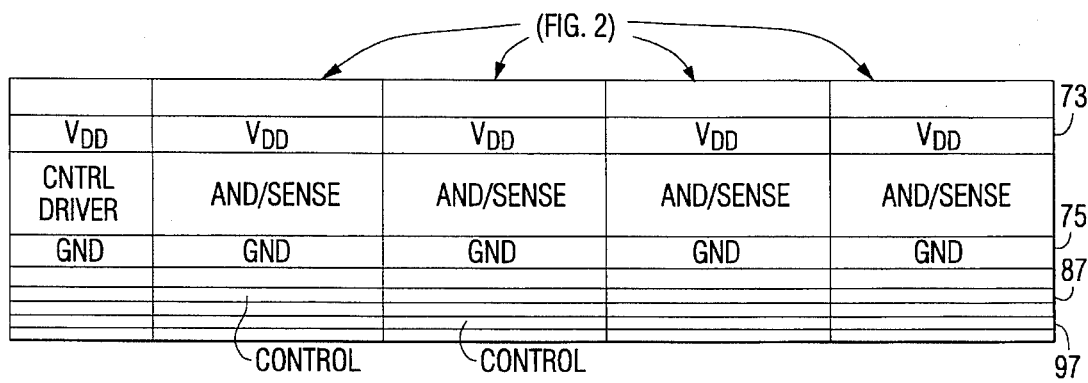
FIG. 3 diagrammatically illustrates placement of respective ones of the cells having the cell topography of FIG. 2, in boundary edge-abutting relationship, so as to effectively enable each of the parallel links to form a respective continuous link through all the cells of a respective row of a multi-cell matrix.

In the cell topography of FIG. 2, the control lines 47 and 57 of the circuit schematic of FIG. 1 are shown as first and second (first metal) control links 87 and 97, which are parallel to one another and extend the width of the cell between opposing cell boundary edges 61 and 65. Because each of the power supply links 73 and 75 and the first and second metallic control links 87 and 97 are parallel with one another and extend between opposing boundary edges of the cell, placement of respective ones of the cells having the cell topography of FIG. 2 in boundary edge-abutting relationship, as diagrammatically illustrated in FIG. 3, effectively enables each of the parallel links to form a respective continuous link through all the cells of a respective row of a multi-cell matrix.

Figure 4:
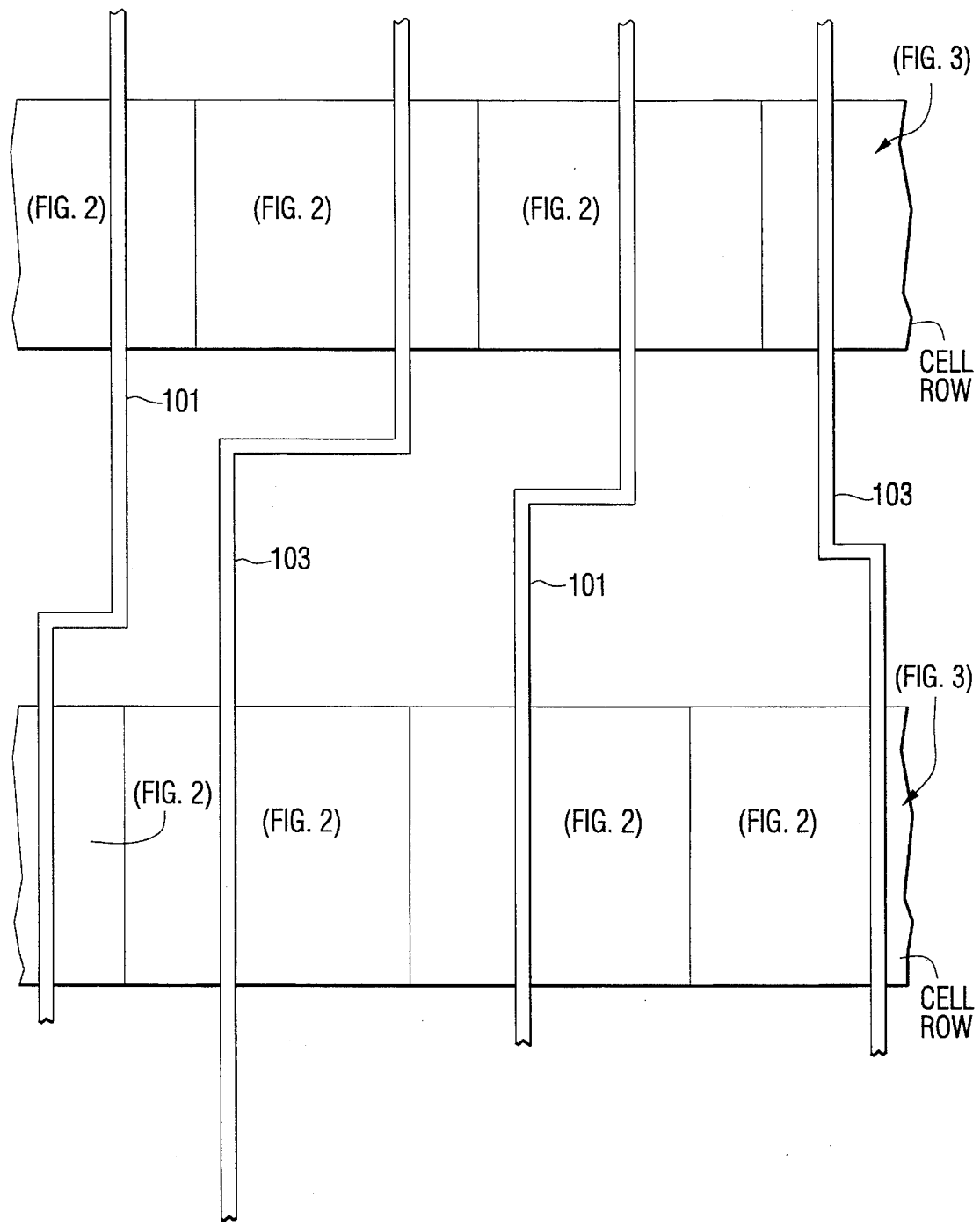
FIG. 4 diagrammatically illustrates the manner in which locating sense output nodes at cell boundary edges allows the sense output nodes to be bridged by a layer of metal, extending in a column direction of a multi-cell matrix.

In addition to locating the respective source contact regions 83 and 93 adjacent to or in relatively close proximity to respective cell boundary edges 61 and 63, as described above, the cell topography of FIG. 2 also locates the first sense output terminal 45, to which the drain 43 of MOSFET 41 is connected via link 44, directly on or intersecting cell boundary edge 61, and the second sense output terminal 55, to which the drain 53 of MOSFET 51 is connected via link 54, directly on or intersecting cell boundary edge 65. Locating sense output nodes 45 and 55 at cell boundary edges 61 and 65, respectively, allows sense output nodes 45, 55 to be readily bridged by an output terminal interconnect link of second metal, diagrammatically illustrated at 101, 103 in FIG. 4, extending in a column direction of a multi-cell matrix, namely, in direction orthogonal to the first and second metallic control links 87, 97, in order to interconnect edge-located sense output nodes 45, 55 of successive rows of cells.

Also shown in the cell topography of FIG. 2, and extending in a direction orthogonal to the first and second metallic control links 87, 97, are one or more (e.g. first and second in the case of the illustrated two sense node cell) control node connection links 111, 113. Control node connection links 111, 113, being located within a respective cell, are relatively short, and may be formed of polysilicon interconnect, extending between the respective gates 46, 56 of sense MOSFETS 41, 51 and the first and second control links 87, 97.

Figure 5:
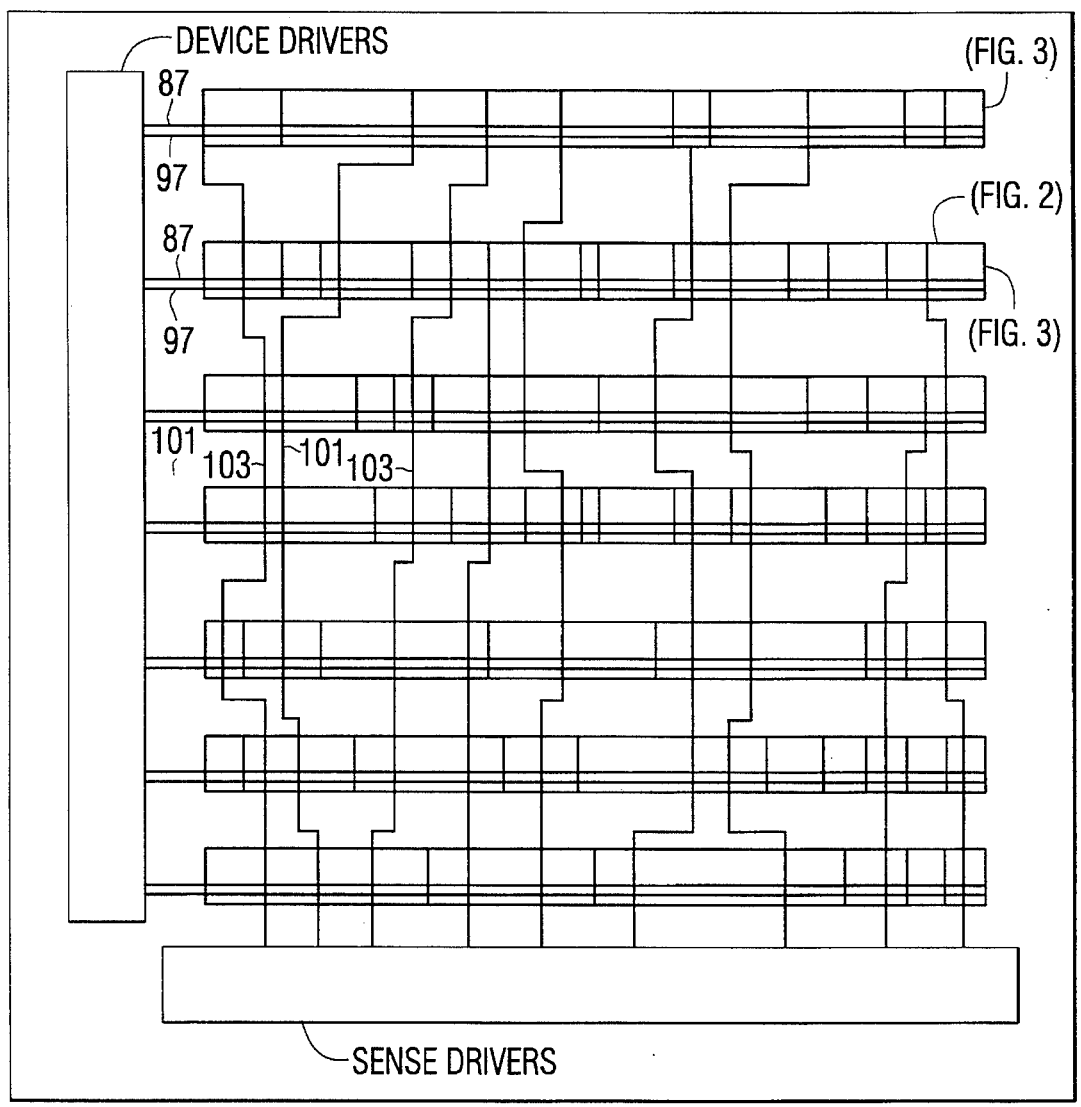
FIG. 5 diagrammatically illustrates a signal processing system architecture comprised of a matrix of rows and columns of standard cells of FIG. 2 and the manner in which test circuitry is interfaced with the cells of the matrix through address/control links extending in the row direction of the matrix and sense output links extending in the column direction of the matrix.

FIG. 5 diagrammatically illustrates a signal processing system architecture comprised of a matrix of rows and columns of standard cells of FIG. 2 and the manner in which external test circuitry is interfaced with the cells of respective rows the matrix through pairs of address/control links 87, 97 for each row, and sense output links 101, 102 that interconnect shared sense output terminals (45, 55 of a respective cell) of cells of adjacent rows of the matrix.

For a respective row, in order to prevent the sense nodes of abutting cells which share the same sense output terminal from being simultaneously coupled to the shared sense output terminal, their associated control node connection links are coupled to respectively different ones of the first and second control links through which the sense MOSFETs are addressed. Thus, for a pair of abutting ones of the standard cell topography of FIG. 2, where the left hand cell boundary edge 61 of an arbitrary cell i within a row of cells abuts the right hand cell boundary edge 65 of an immediately adjacent cell i–1, and the right hand cell boundary edge 65 of cell i abuts the left hand cell boundary edge 61 of an immediately adjacent cell i+1, control node connection link 113 of sense MOSFET 51 of cell i–1 will be connected to a different one of the control links 87, 97 than will control node connection link 111 of sense MOSFET 41 of cell i, and control node connection link 113 of sense MOSFET 51 of cell i will be connected to a different one of the control links 87, 97 than will control node connection link 111 of sense MOSFET 41 of cell i+1.

Thus, by providing a pair of control lines that may be directly abutted (directly electrically connected) with those of a pair of adjacent (abutting) cells and the ability to share a pair of sense output terminals with the pair of abutting cells, the topography of the present invention not only reduces circuit occupation area, but facilitates the ability of external test access circuitry to access a selected (addressed) one of the sense nodes of any cell of the matrix. Moreover, since both the control links and the output links are formed of metal, rather than polysilicon, they have relatively low resistance and parasitic capacitance compared with those of polysilicon, so that test access time (addressing via the row direction-extending control links 87, 97 and column direction-extending readout links 101, 102) is reduced significantly.

It will be observed that locating the first and second sense MOSFETs in proximity of and disposing their associated sense output terminals at opposing cell boundary edges effectively creates bilateral symmetry about an axis orthogonal to the control lines, so as to allow the standard cell to be effectively 'flipped' or a mirror image of the cell to be used, in the course of generating a place and route mapping scheme that defines the multicell matrix architecture of a given signal processing system design. Namely, the parallel placement of power bus links 73 and 75 and control links 87, 97 means that the electrical routing of both power and address control links of the auxiliary test system is automatically taken into account during the layout of a system level architecture, without the need for special mapping of test address line interconnects by the routing mechanism.

It should be also be noted that the choice of which control link is to be connected to a respective control node connection link is deferrable until placement of the cells of a respective row has been determined, so as to ensure that switching MOSFETs which share a common sense output terminal will not be turned on from the same control link. As noted earlier, to prevent the sense nodes of abutting cells from being simultaneously coupled to a shared sense output terminal, their associated control node connection links must be coupled to respectively different ones of the first and second control links through which the sense MOSFETs are addressed. Thus, for a respective cell containing two sense MOSFETs, as in the embodiment of FIG. 2, not only are control node connection links 111 and 113 connected to respectively different ones of control links 87, 97, but control link 111 of cell i is connected to a different one of control links 87, 97 than is control link 113 of cell i–1, and control link 113 of cell i is connected to a different one of control links 87, 97 than is control link 111 of cell i+1.

As will be appreciated from the foregoing description, the excessively high resistance and significant parasitic capacitance associated with the use of long runs of polysilicon as test access interconnect material, and the need to tailor the configuration and placement of the sense components within a standard cell, in order to facilitate the fabrication of a multicell architecture of standard cells that can be readily arranged in mutual adjacency and interconnected with one another in a compact integrated circuit architecture, are successively addressed by the cell topography of the present invention, which efficiently locates, within a respective cell, one or more (e.g. a pair of) addressable switching circuits and associated test access control lines that occupy minimal semiconductor real estate, while providing for two-dimensional hardware interconnect and test signal (control and sense signal) flow throughout an overall system design.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacture of a semiconductor circuit cell architecture, in accordance with a cell topography that facilitates placement of respective cells in abutting relationship in a multiple cell layout, and testing of said respective cells, prior to routing interconnect material to conductive links within and to selected nodes among said respective cells, said method of manufacture comprising the steps of:

(a) forming a semiconductor circuit at a first physical location of a generally rectangular physical topography geometry of a semiconductor cell, said generally rectangular physical topography geometry of said semiconductor cell having a plurality of cell boundary edges, said semiconductor circuit having an input terminal to which an input signal is applied, an output terminal from which an output signal is derived, first and second sense nodes, for monitoring an operation of said semiconductor circuit, and first and second sense output terminals, said first and second sense output terminals intersecting first and second opposite ones of said plurality of cell boundary edges;

(b) forming first and second controllable semiconductor switching devices at a second physical location of said generally rectangular physical topography geometry of said semiconductor cell, adjacent to said first physical location of said generally rectangular physical topography geometry of said semiconductor cell, said first and second controllable semiconductor switching devices being controllably operative to respectively couple said first and second sense nodes to said first and second sense output terminals, and wherein said first controllable semiconductor switching device has a first output node physically located in proximity with a first cell boundary edge, a first input node physically located adjacent to said semiconductor circuit, so as to facilitate placement of a first connection link to said first sense node of said semiconductor circuit, and a first control node, and wherein said second controllable semiconductor switching device has a second output node physically located in proximity with a second cell boundary edge, a second input node located physically adjacent to said semiconductor circuit, so as to facilitate physical placement of a second connection link to said second sense node of said semiconductor circuit, and a second control node, and wherein said first control node, in response to receiving a control signal supplied by a test circuit, controllably causes said first controllable semiconductor switching device to provide a conductive path between said first sense node and said first sense output terminal, and wherein said second control node, in response to receiving a control signal supplied by said test circuit, controllably causes said second controllable semiconductor switching device to provide a conductive path between said second sense node and said second sense output terminal;

(c) physically forming first and second conductive control links at a third physical location of said semiconductor substrate, said first and second conductive control links being disposed parallel to one another and extending between said first and second opposite cell boundary edges, so as to allow physical placement of respective cells in cell boundary edge-abutting relationship, in order to effectively form continuous physical runs of each of said first and second conductive control links through mutually abutting cells;

(d) prior to routing interconnect material among respective ones of a plurality of said semiconductor cells and prior to forming control node connection links that serve to electrically selectively interconnect control nodes of said first and second controllable semiconductor switching devices and selected ones of said first and second conductive control links, placing a plurality of said semiconductor cells in abutting relationship, such that the first cell boundary edge of a respective semiconductor cell abuts the second semiconductor cell boundary edge of another semiconductor cell, with first and second sense nodes of abutting cells being disposed adjacent to one another, to be connected to the same output terminal interconnect link; and (e) physically forming first and second control node connection links so as to electrically interconnect said respective first and second control nodes of said first and second controllable semiconductor switching devices and selected ones of said first and second conductive control links, and physically routing output terminal interconnect links among selected abutting cells and connecting said output terminal interconnect links to selected first and second sense nodes, such that first and second controllable semiconductor switching devices, whose respective first and second sense nodes are connected to the same output terminal interconnect link, are connected to different control node connection links.

2. A method according to claim 1, wherein said semiconductor circuit cell architecture has a third cell boundary edge which intersects said first and second cell boundary edges, and wherein step (c) comprises physically forming said first and second conductive control links parallel to one another and said third cell boundary edge.

3. A method according to claim 1, wherein step (c) comprises physically forming said first and second control links in proximity with said first and second controllable semiconductor switch devices.

4. A method according to claim 1, wherein said first and second controllable semiconductor switch devices comprise first and second field effect transistors, respectively, and wherein each of said first and second field effect transistors has one of its source and drain electrodes coupled to a respective one of said first and second sense nodes, and the other of its source and drain electrodes coupled to a respective one of said first and second output nodes, and wherein step (e) comprises forming said first control node connection links so as to be electrically connected to the gate electrode of said first field effect transistor, and forming said second control node connection link so as to be electrically connected to the gate electrode of said second field effect transistor.

5. A method of manufacture of a multi-cell integrated circuit architecture, in accordance with a cell topography that facilitates placement of respective cells, in abutting relationship in a multiple cell layout, and testing of said respective cells, prior to routing interconnect material to conductive links within and to selected nodes among said respective cells, said method of manufacture comprising the steps of:

(a) forming a matrix of rows and columns of semiconductor circuit cells in a semiconductor substrate, such that a respective row of cells contains cells arranged in edge-to-edge abutment with one another, and wherein each of plural ones of said cells have a standard cell configuration that comprises:

(i) a generally rectangular semiconductor topography geometry defined by four mutually orthogonal cell boundary edges and including a semiconductor circuit disposed at a first physical location thereof, said semiconductor circuit having an input terminal to which an input signal is applied, an output terminal from which an output signal is derived, first and second sense nodes for monitoring an operation of said semiconductor circuit, and first and second sense output terminals, first and second sense output terminals intersecting said first and second cell boundary edges, thereby allowing sense output terminals of cells of adjacent rows of a matrix of cells to be electrically interconnected by a conductive layer therebetween physically extending in a direction generally parallel to edge-to-edge abutment of cells of a respective row of cells; and (ii) first and second controllable semiconductor switching devices, located at a second physical location of said generally rectangular semiconductor topography geometry, adjacent to said first physical location, and which are controllably operative to respectively couple said first and second sense nodes to said first and second sense output terminals, said first controllable semiconductor switching device having a first output node located in physical proximity with a first cell boundary edge, a first input node physically located adjacent to said semiconductor circuit, so as to facilitate placement of a first connection link to said first sense node of said semiconductor circuit, and a first control node, said second controllable semiconductor switching device having a second output node located in physical proximity with a second cell boundary edge, opposite to said first cell boundary edge, a second input node physically located adjacent to said semiconductor circuit, so as to facilitate physical placement of a second connection link to said second sense node of said semiconductor circuit, and a second control node, and wherein said first control node, in response to receiving a control signal supplied by a test circuit, controllably causes said first controllable semiconductor switching device to provide a conductive path between said first sense node and said first sense output terminal, and wherein said second control node, in response to receiving a control signal supplied by said test circuit, controllably causes said second controllable semiconductor switching device to provide a conductive path between said second sense node and said second sense output terminal;

(b) forming first and second conductive control links extending parallel to one another across said standard cell between said first and second opposite cell boundary edges, so as to afford placement of respective cells in cell boundary edge-abutting relationship, in order to effectively form continuous runs of each of said first and second conductive control links through mutually abutting cells;

(c) prior to forming control node connection links which selectively electrically interconnect control nodes of said first and second controllable switching devices and selected ones of said first and second conductive control links, and prior to routing interconnect material among respective ones of a plurality of said standard cells, placing a plurality of said standard cells in abutting relationship, such that the first cell boundary edge of one cell abuts the second cell boundary edge of another cell, with first and second sense nodes of abutting cells being disposed adjacent to one another for connection to the same output terminal interconnect line;

(d) forming first and second control node connection links to interconnect said respective first and second control nodes of said first and second controllable semiconductor switching devices and selected ones of said first and second conductive control links, such that first and second controllable semiconductor switching devices, whose first and second sense nodes are connected to the same sense output terminal interconnect link, are connected to different control node connection links; and (e) selectively routing sense output terminal interconnection links among the first and second sense output terminals of cells of adjacent rows of cells, and connecting said sense output terminal interconnect links to selected first and second sense nodes.

6. A method according to claim 5, wherein said cell configuration includes a third cell boundary edge which intersects said first and second cell boundary edges, and wherein said first and second conductive control links are formed in step (b) so as to be parallel to one another and said third cell boundary edge.

7. A method according to claim 5, wherein said first and second controllable semiconductor switch devices comprise first and second field effect transistors, respectively, and wherein each of said first and second field effect transistors has one of its source and drain electrodes coupled to a respective one of said first and second sense nodes, and the other of its source and drain electrodes coupled to a respective one of said first and second output nodes, and wherein step (d) comprises forming said first control node connection link so as to be connected to the gate electrode of said first field effect transistor, and forming said second control node connection link so as to be connected to the gate electrode of said second field effect transistor.

8. A method of manufacture of a semiconductor circuit cell architecture, in accordance with a cell topography that facilitates placement of respective cells in abutting relationship in a multiple cell layout, and testing of said respective cells, prior to routing interconnect material to conductive links within and to selected nodes among said respective cells, said method of manufacture comprising the steps of:

(a) forming a semiconductor circuit at a first physical location of a generally rectangular physical topography geometry of a semiconductor cell, said semiconductor circuit having an input terminal to which an input signal is applied, an output terminal from which an output signal is derived, a sense node for monitoring an operation of said semiconductor circuit, and a sense output terminal;

(b) forming a controllable semiconductor switching device at a second physical location of said generally rectangular physical topography geometry of said semiconductor cell, said controllable semiconductor switching device being controllably operative to couple said sense node to said sense output terminal, and wherein said controllable semiconductor switching device has an output node, an input node, and a control node, and wherein said control node, in response to receiving a control signal supplied by a test circuit, controllably causes said controllable semiconductor switching device to provide a conductive path between said Sense node and said sense output terminal;

(c) physically forming a conductive control link which extends across said semiconductor cell, so as to afford physical placement of respective cells in cell-to-cell mutually abutting relationship, in order to effectively form a continuous physical run of said conductive control link through mutually abutting cells;

(d) prior to forming control node connection links that serve to selectively electrically interconnect control nodes of controllable switching devices of semiconductor cells that are placed so as to abut one another and selected ones of conductive control links of abutting semiconductor cells, and prior to routing interconnect material among respective ones of a plurality of abutting semiconductor cells, placing a plurality of abutting semiconductor cells in abutting relationship such that sense nodes of abutting semiconductor cells are disposed adjacent to one another for interconnection to a common output terminal link; and (e) physically forming a control node connection link so as to electrically interconnect said control node of said controllable semiconductor switching device and said conductive control link, and physically routing output terminal interconnect links among selected abutting semiconductor cells, and connecting said output terminal interconnect links to selected sense nodes, such that controllable semiconductor switching devices, whose sense nodes are connected to the same output terminal interconnect link, are connected to different control node connection links.

9. A method according to claim 8, wherein said semiconductor circuit cell architecture has a cell boundary edge which intersects opposite cell boundary edges, and wherein step (c) comprises physically forming said conductive control link to be parallel to said cell boundary edge.

10. A method according to claim 8, wherein step (c) comprises physically forming said control link in proximity with said controllable semiconductor switch device.

11. A method according to claim 8, wherein said controllable semiconductor switch device comprises a field effect transistor, having one of source and drain electrodes thereof coupled to said sense node, and the other of source and drain electrodes thereof coupled to said output node, and wherein step (e) comprises forming said control node connection link so as to be electrically connected to the gate electrode of said field effect transistor.

12. A method according to claim 8, wherein said sense output terminal intersects one of said opposite cell boundary edges.

13. A method of manufacture of a multi-cell integrated circuit architecture, in accordance with a cell topography that facilitates placement of respective cells in abutting relationship in a multiple cell layout, and testing of said respective cells prior to routing interconnect material to conductive links within and to selected nodes among said respective cells, said method of manufacture comprising the steps of:

(a) forming a matrix of rows and columns of semiconductor circuit cells in a semiconductor substrate, such that a respective row of cells contains cells arranged in mutual abutment with one another, and wherein each of plural ones of said cells have a standard cell configuration that comprises:
  (i) a generally rectangular semiconductor topography geometry and including a semiconductor circuit disposed at a first physical location thereof, said semiconductor circuit having an input terminal to which an input signal is applied, an output terminal from which an output signal is derived, a sense node for monitoring an operational of said semiconductor circuit, and a sense output terminal;
  (ii) a controllable semiconductor switching device, located at a second physical location of said generally rectangular semiconductor topography geometry, and which is controllably operative to couple said sense node to said sense output terminal, said controllable semiconductor switching device having an output node, an input node, and a control node, and wherein said control node, in response to receiving a control signal supplied by a test circuit, controllably causes said controllable semiconductor switching device to provide a conductive path between said sense node and said sense output terminal;

(b) forming a conductive control link extending across said standard cell so as to afford placement of respective cells in said mutual abutting relationship, in order to effectively form a continuous run of said conductive control link through mutually abutting cells;

(c) prior to forming control node connection links that serve to selectively electrically interconnect control nodes of controllable switching devices of cells that are placed to abut one another and selected ones of conductive control links of said abutting cells, and prior to routing interconnect material among respective ones of a plurality of said semiconductor cells, placing a plurality of said semiconductor cells in abutting relationship such that sense nodes of abutting cells are disposed adjacent to one another so as to be interconnectable to a common output terminal link; and (d) forming a control node connection link to interconnect said control node of said controllable semiconductor switching device and said control connective link, such that respectively different controllable semiconductor switching devices, whose sense nodes are connected to the same terminal interconnect link are connected to different control node connection links; and (e) selectively routing sense output terminal interconnection links among the output terminals of cells of adjacent rows of cells, and connecting said sense output terminal interconnect links to selected sense nodes.

14. A method according to claim 13, wherein said cell configuration includes a cell boundary edge which intersects opposite cell boundary edges, and wherein said conductive control link is formed in step (b) so as to be parallel to said cell boundary edge.

15. A method according to claim 13, wherein said controllable semiconductor switch device comprises a field effect transistor having one of its source and drain electrodes coupled to said sense node, and the other of its source and drain electrodes coupled to said output node, and wherein step (d) comprises forming said control node connection link so as to be connected to the gate electrode of said field effect transistor.

16. A method according to claim 13, wherein said sense output terminal intersects one of said opposite cell boundary edges, thereby allowing sense output terminals of cells of adjacent rows of a matrix of cells to be electrically inter connected by a conductive layer therebetween physically extending in a direction generally parallel to mutual abutment of cells of a respective row of cells.

* * * * *